United States Patent [19]

Baker et al.

[11] Patent Number: 5,771,182
[45] Date of Patent: Jun. 23, 1998

[54] BIT-SERIAL DIGITAL COMPRESSOR

[75] Inventors: James Clark Baker, Crystal Lake; John Paul Oliver, Chicago, both of Ill.

[73] Assignee: Motorola, Inc., Schaumburg, Ill.

[21] Appl. No.: 659,104

[22] Filed: May 31, 1996

[51] Int. Cl.$^6$ .............................. G06F 7/00; G06F 15/00; G06F 7/52; G06M 3/00

[52] U.S. Cl. ............................ 364/715.02; 364/724.011; 364/736.01; 364/761; 364/766; 377/51

[58] Field of Search ............................... 364/715.02, 852, 364/766, 736, 821, 761–765, 724.011; 370/109, 7; 377/33, 51; 235/164; 381/35; 395/2.38; 455/72; 375/113; 331/1

[56] References Cited

U.S. PATENT DOCUMENTS

| | | | |
|---|---|---|---|
| 3,274,341 | 9/1966 | Allen | 179/15.55 |
| 3,378,677 | 4/1968 | Waldecker et al. | 235/164 |
| 3,816,733 | 6/1974 | Sather | 235/164 |
| 4,271,499 | 6/1981 | Leveque | 370/7 |
| 4,285,047 | 8/1981 | Ohnishi | 364/164 |
| 4,799,242 | 1/1989 | Vermeulen | 375/241 |
| 4,802,222 | 1/1989 | Weaver | 381/35 |
| 4,930,126 | 5/1990 | Kazecki et al. | 370/109 |
| 5,065,451 | 11/1991 | Leveque | 455/72 |
| 5,122,762 | 6/1992 | Molina et al. | 331/1 |
| 5,204,831 | 4/1993 | Gazsi et al. | 364/285 |
| 5,226,004 | 7/1993 | Mitsutsuka | 364/821 |
| 5,270,962 | 12/1993 | Fettweis | 364/766 |
| 5,303,279 | 4/1994 | Fujii | 377/51 |
| 5,321,645 | 6/1994 | Konstantinides et al. | 364/852 |
| 5,337,338 | 8/1994 | Sutton et al. | 377/33 |
| 5,388,126 | 2/1995 | Rypinski et al. | 375/113 |
| 5,459,681 | 10/1995 | Harrison et al. | 364/736 |
| 5,583,967 | 12/1996 | Akagiri | 395/2.38 |

*Primary Examiner*—Emmanuel L. Moise
*Attorney, Agent, or Firm*—Sylvia Chen

[57] ABSTRACT

A bit-serial compressor (106) has a pre-divider circuit (208) receiving input serial data and generating a partial numerator. Divider circuit (210) divides the partial numerator by a denominator and generates a partial remainder that is fed back to the pre-divider circuit (208). Divider circuit (210) also generates serial data that is sent to an absolute value circuit (216) and then to a bit-serial filter (218). Bit-serial filter (218) generates an average signal from the serial data. A comparator circuit (224) compares the average signal to a threshold signal and generates the greater of the average signal or the threshold signal for use as a denominator in a next division cycle. The divider circuit includes an overflow control circuit (618) which detects overflow from the carryout bit of the partial remainder operation at the beginning of a division cycle and the sign bit of the numerator. If overflow is detected, the output is clipped according to whether the numerator is positive or negative.

20 Claims, 9 Drawing Sheets

BIT-SERIAL DIGITAL COMPRESSOR

CROSS-REFERENCE TO RELATED APPLICATIONS

This application is related to application Ser. No. 08/631,321 pending entitled "Method and Apparatus for Setting a Bit-Serial Filter to an All-Zero State" by James C. Baker and Denise Riemer (Attorney Docket No. CE01069R) filed Apr. 11, 1996, the specification of which is incorporated herein by reference. This application is also related to application Ser. No. 08/656,131 pending entitled "Bit-Serial Digital Expandor" by James C. Baker (Attorney Docket No. CE01070R) filed same date herewith, the specification of which is incorporated herein by reference.

FIELD OF THE INVENTION

This invention relates generally to digital signal processing, and more particularly to a compressor for a bit-serial digital signal processing circuit.

BACKGROUND OF THE INVENTION

Any digital filter can be built using bit-serial architecture, which reduces the gate count, silicon area, and current drain of the integrated circuit compared to an equivalent parallel filter design. Bit-serial filters use three basic building blocks: bit-serial adders, bit-serial scalers, and bit-serial delays. A bit-serial adder has only one full adder with two one-bit inputs and a single one-bit output. To achieve a dynamic range equivalent to that of a twenty-four bit parallel adder, the clock rate of the bit-serial adder is increased by a factor of twenty-four compared to the parallel adder. Generally speaking, $f_{bit}=B*f_{sample}$, where $f_{bit}$ is the bit-serial adder clock rate, B is the number of bits in a word, and $f_{sample}$ is the digital word sampling rate. Each bit in a word, from the least significant bit (LSB) to the most significant bit (MSB), appears on a serial bus for one bit time period, $1/f_{bit}$. Bit-serial scaling is achieved by shifting bits in a word to the right by N bits using a bit-repeater block and sign-extending the MSB, which results in a multiplication by $2^{-N}$. Summing bit-shifted versions of the input word results in a word multiplied by a selected coefficient. Bit-serial delays are implemented using a shift register that holds a bit for a predetermined number of bit time periods using flip-flops.

Bit-serial designs also require a controller. The bit-serial controller can be viewed as a shift register with a "one" signal of one bit time period circulating sequentially through the shift register. The length of the shift register is equal to the number of bits in a word, B. Signals from the bit-serial controller must be routed to adder blocks to coincide with the clock cycle that the first bit of a word, the LSB, appears at the input to a particular adder block. Signals from the bit-serial controller are also routed to bit-repeater blocks to specify a scaling coefficient for each particular bit-repeater block. Bit-serial architecture enables digital filters and other digital signal processing elements to have reduced gate count, silicon area, and current drain compared to parallel architecture digital filters. The trade-off for this reduced gate count is a higher clock speed.

The bit-serial controller and these three basic bit-serial building blocks, however, cannot be combined to create a bit-serial compressor. Compressing at a transmitter and expanding at a receiver (companding) is a widely-used technique for increasing the dynamic range of an analog signal and improving the quality of the signal to better withstand noise in a communication channel. Companding is specified in all analog cellular telephone systems and a number of other analog communication systems. Thus, there is a need for a bit-serial digital compressor in order to obtain the bit-serial architecture advantages of reduced gate count, silicon area, and current drain in an analog communication environment.

SUMMARY

A bit-serial digital compressor is implemented using a bit-serial divider, a bit-serial absolute value circuit, and a bit-serial filter. Using this bit-serial compressor in an Advanced Mobile Phone System (AMPS) portable radiotelephone or other communication device utilizing companding, results in reduced gate count, silicon area, and current drain compared to parallel compressors. This reduction in current drain is particularly advantageous in portable battery-operated devices and other environments where current drain is an important consideration.

DETAILED DESCRIPTION OF THE INVENTION

Figures 1, 8:
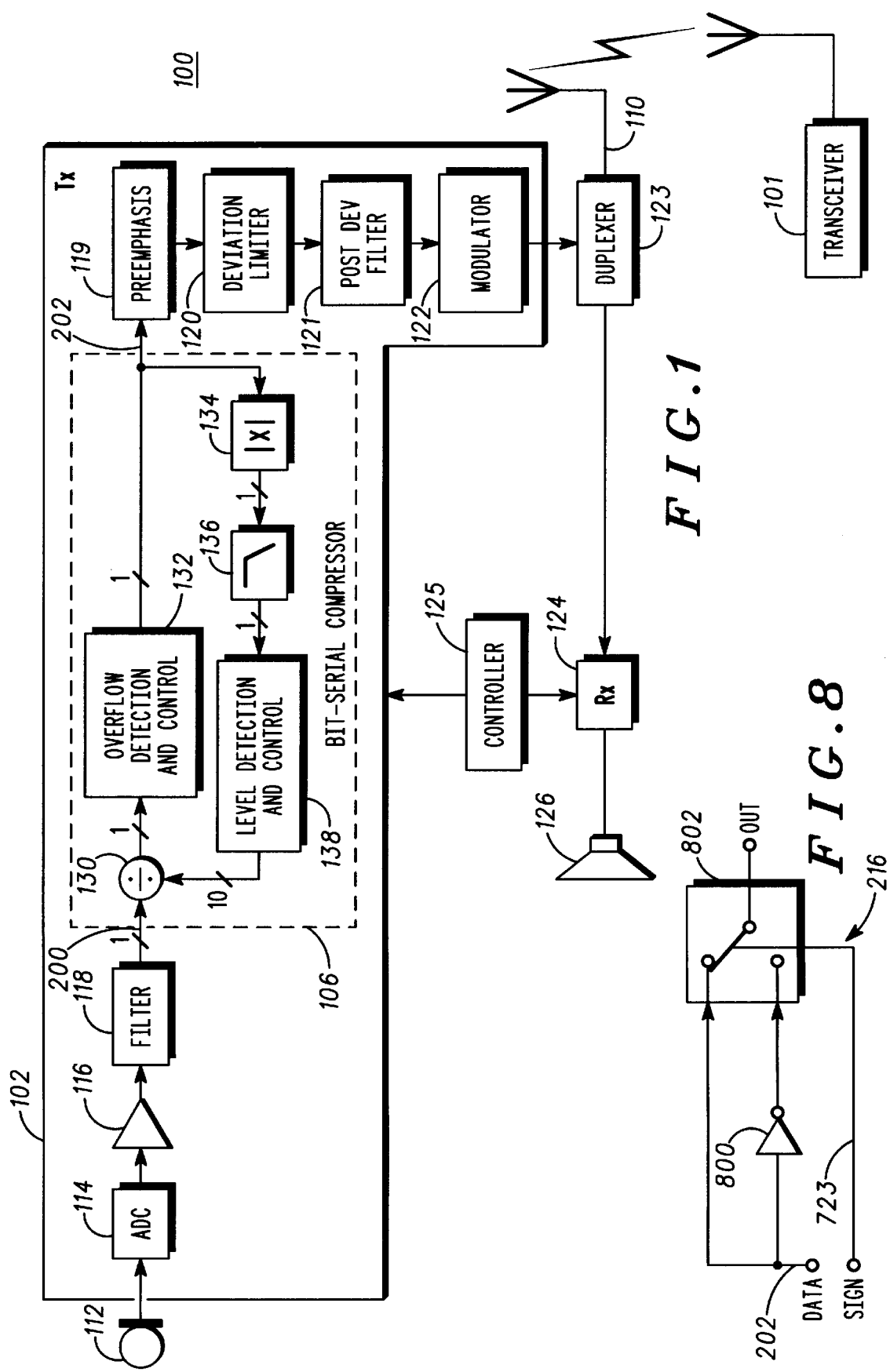
FIG. 1 is a block diagram illustrating a radiotelephone.
FIG. 8 is a block diagram illustrating an absolute value circuit.

FIG. 1 shows a communication device 100, such as a radiotelephone including a transmitter 102. The transmitter 102 includes a bit-serial compressor 106. Although the illustrated device has a transmitter and a receiver, the bit-serial compressor can be employed in any device requiring a compressor. Thus the bit-serial compressor can be employed in a MODEMs (modulator/demodulators), two-way radios, land-line telephones, recording instruments, cellular telephones, cordless telephones, radio frequency transmitters, or the like. Accordingly, as used herein, "device" refers to each of these and their equivalents.

The transmitter 102 of communication device 100 includes an analog-to-digital converter (ADC) 114 for receiving electrical signals from microphone 112. The ADC 114 converts the analog electrical signals from the microphone 112 into serial data. The output of the ADC 114 is input to an amplifier 116 having a gain selected to help protect against overflow in the bit-serial compressor 106.

The output of amplifier 116 is connected to a filter circuit 118 that removes noise by passing only certain signals. Filter circuit 118 may for example pass only frequency components between approximately 300 Hz and 3 kHz, thereby removing frequency components substantially outside of the voice band. A lowpass filter with a cut-off frequency of 3000 Hz connected in series with a highpass filter having a cut-off frequency of 300 Hz can effect filter circuit 118.

The output of filter circuit 118 is connected to a bit-serial compressor 106. The bit-serial compressor includes a divider 130, overflow detection and control 132, an absolute value circuit 134, a lowpass filter 136, and level detection and control 138. This embodiment of the bit-serial digital compressor 106 has been designed to mimic AMPS compressors in existing transmitters. An input below a pre-set threshold will produce a unitary gain (i.e., the input vs. output gain curve is 1:1) to prevent low level noise from being greatly amplified.

The output of the bit-serial compressor 106 is processed for transmission in a pre-emphasis filter 119, limited in a limiter 120, and filtered in a post deviation filter 121. The transmitter 102 operates under the control of a controller 125, which can be implemented using a microprocessor, a digital signal processor, or the like. The controller 125 generates the carrier signal, which may for example be a 800 MHz signal of the type used in analog cellular phone systems. The carrier signal and the signal output of post deviation filter 121 are combined in a modulator 122, and the modulated signal is sent to an antenna 110 via a duplexer 123.

The antenna 110 is coupled to both transmitter 102 and receiver 124 via a duplexer 123. The antenna 110 emits signals generated by transmitter 102 for transmission to a complementary device 101. The antenna 110 also receives radio frequency signals communicated to communication device 100 from the complementary communication device 101. The receiver 124 receives signals detected by antenna 110 and outputs audio signals to a speaker 126. The receiver 124 operates under the control of controller 125. Although the receiver 124 can be implemented using any conventional circuitry, it is envisioned that the receiver will employ a bit-serial expander described in copending application Ser. No. 08/656,131 entitled "Bit-Serial Digital Expandor" by James C. Baker (Attorney Docket No. CE01070R).

The bit-serial compressor 106 will now be described in greater detail with reference to FIGS. 2–10. The bit-serial compressor 106 receives N-bit serial data representing a numerator at input 204 on conductor 200. The serial data on conductor 200 and a partial remainder on bus 207 are converted to an M-bit partial numerator in pre-divider circuit 208. M is the number of bits in the denominator; M is also the number of bits in a partial numerator. The pre-divider circuit 208 generates N M-bit signals from each input word, wherein N is the number of bits in the words input to the bit-serial compressor 106 on conductor 200. For this example, N is equal to twenty-four and M is equal to ten. Those skilled in the art, however, will recognize that the compressor can be implemented using other word lengths and other partial numerator and denominator lengths.

Bit-serial controller 290 generates control signals c[0]–c[23] to indicate when the LSB of a word enters an adder, to indicate scaling coefficients, and to synchronize and control the compressor circuit as a whole.

Pre-divider circuit 208 and divider circuit 210 implement a non-restoring division algorithm. The ten-bit partial numerator output by the pre-divider circuit 208 is sent to divider circuit 210. Divider circuit 210 divides the ten-bit partial numerator from pre-divider circuit 208 by a feedback signal on bus 209, which is the denominator. The divider circuit 210 outputs a quotient serially at output 211 and a ten-bit partial remainder on bus 207. The pre-divider circuit 208 and the divider circuit 210 are a bit-serial divider, which is a divider that receives bit-serial data and outputs bit-serial quotients. The divider circuit 210 also provides overflow control.

The output of divider circuit 210 is in most significant bit (MSB) first format. The signals are in twos-complement form, such that the most significant bit is the sign bit for the word. In least significant bit (LSB) first format, the first bit is the least significant bit of the word and the sign bit is the last bit of the word. An MSB first to LSB first converter 206 is connected to the output of the divider circuit 210 to convert the serial data output by divider circuit 210 to LSB first format at conductor 202. The sign bit is held in the MSB/LSB converter 206 throughout the time period that the twenty-four bit word is output serially by MSB/LSB converter 206. The output of the MSB/LSB converter 206 on conductor 202 is the output of the compressor.

An absolute value circuit 216 receives the sign bit and the compressor output and rectifies the output serial data.

The absolute value is sent to a bit-serial filter 218. Bit-serial filter 218 is a lowpass filter, which generates an average level of the absolute value signal over a predetermined time period. For example, the filter circuit can have a cut-off frequency of 8 Hz and a decay period of twenty milliseconds.

The output of the bit-serial filter 218 is sent to a delay circuit 220, which can be implemented using shift registers. The delay circuit introduces a delay such that the denominator from comparator circuit 224 is synchronized with the partial numerator from pre-divider circuit 208 at the inputs to divider circuit 210.

The delayed filtered signal output from delay circuit 220 is sent to a comparator circuit 224. The comparator circuit 224 converts the serial data from the delay circuit into a ten-bit parallel signal that is compared to a predetermined threshold. The greater value is output by the comparator circuit as the feedback signal, which is the denominator for divider circuit 210.

Figure 3:
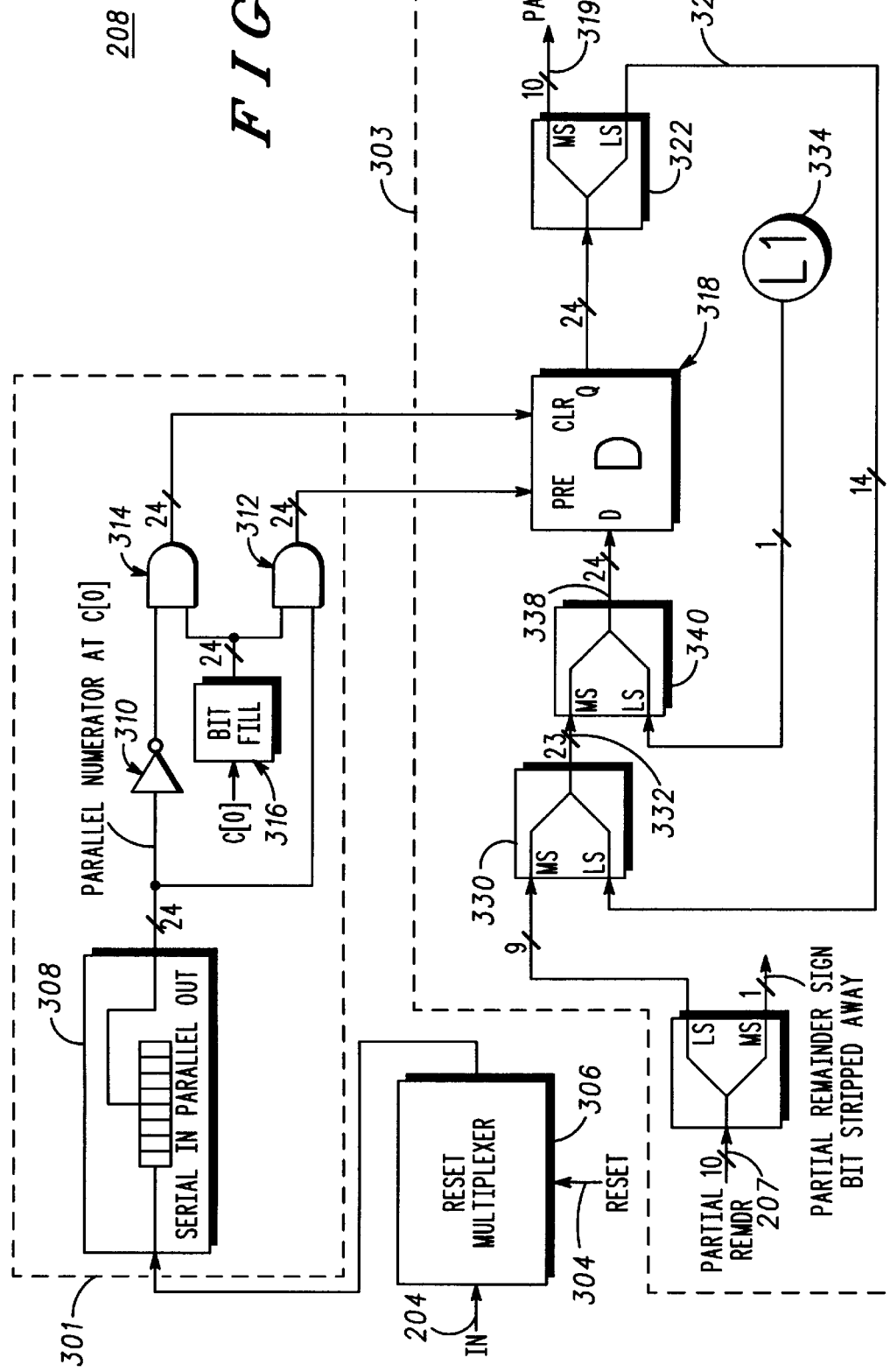
FIG. 3 is a block diagram illustrating a pre-divider circuit of the bit-serial compressor.

With reference to FIG. 3, the pre-divider circuit 208 includes a bit-serial reset multiplexer 306, a parallel load circuit 301, and a partial numerator circuit 303. A bit-serial reset multiplexer 306 allows the pre-divider circuit 208 to be reset using reset signal 304 without using resettable flip-flops according to the disclosure in application Ser. No. 08/631,321 entitled "Method and Apparatus for Setting a Bit-Serial Filter to an All-Zero State" by James C. Baker and Denise Riemer.

The parallel load circuit 301 includes serial-to-parallel converter 308. The serial-to-parallel converter can be implemented using any suitable memory device, such as a serial-in and parallel-out shift register. The shift register should be able to hold a complete word in the system in which the bit-serial compressor is employed, which in this example has twenty-four bits. An inverter circuit 310 and AND gate circuits 312, 314 load a complete word from serial-to-parallel converter 308 into flip-flop circuit 318.

Each AND gate circuit 312, 314 includes twenty-four AND gates, and the inverter circuit 310 includes twenty-four inverters. An input of each of the twenty-four AND gates of AND gate circuit 312 is connected to receive a respective one of the twenty-four bits at the output of the serial-to-parallel converter 308. Each of the twenty-four inverters in inverter circuit 310 receives a respective one of the twenty-four outputs of the serial-to-parallel converter 308. Each inverter output in inverter circuit 310 is connected to an input of a respective one of the twenty-four AND gates in AND gate circuit 314. A second input of each of the AND gates of AND gate circuits 312 and 314 is connected to bit-fill circuit 316.

Figure 2:
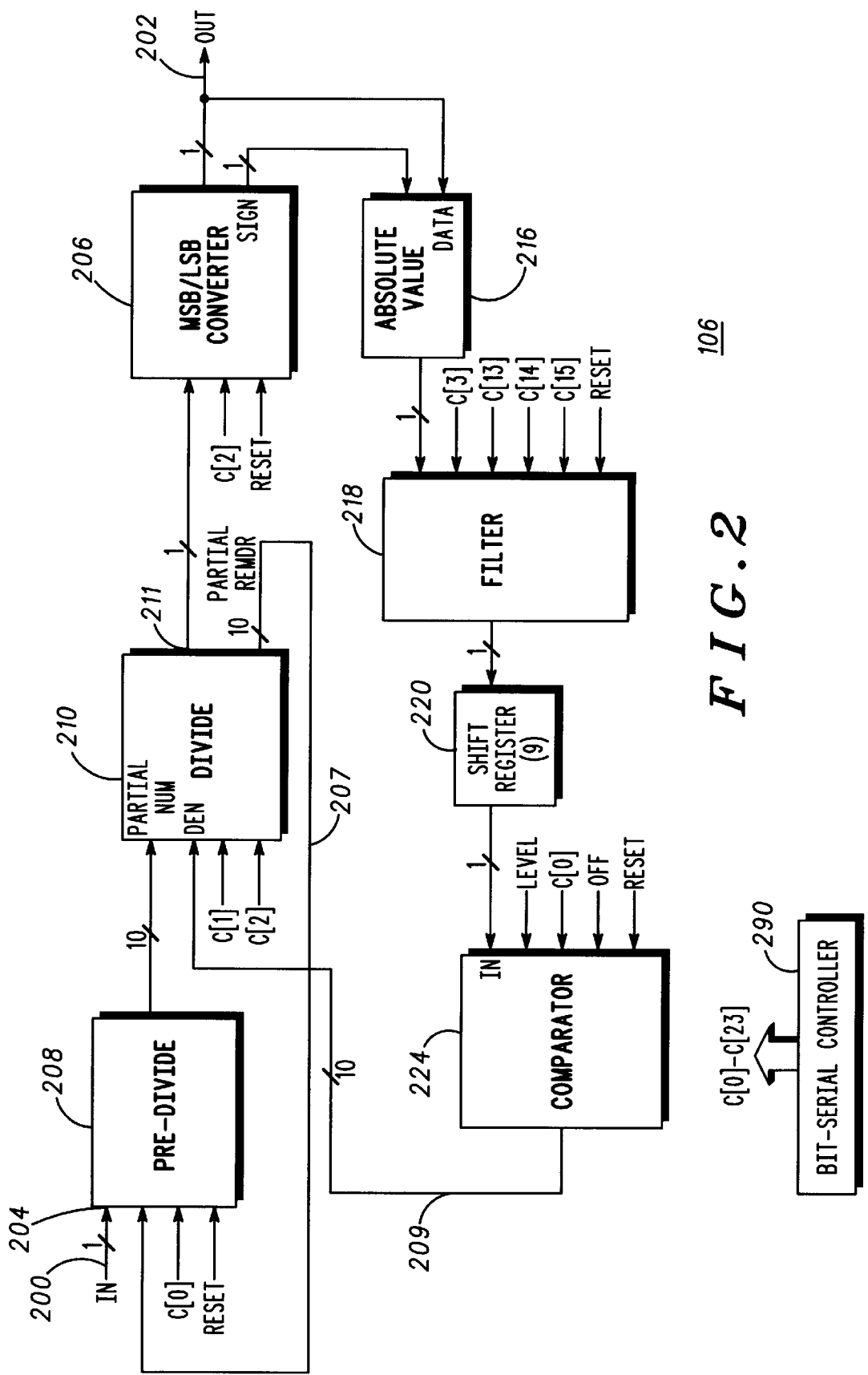
FIG. 2 is a block diagram illustrating a bit-serial compressor.

The bit-fill circuit 316 receives a control signal c[0] from bit-serial controller 290 shown in FIG. 2 and outputs twenty-four signals identical to control signal c[0] on conductors connected to the AND gates in AND gate circuits 312 and 314. The control signal c[0] is a positive logic level pulse that has a high logic level at the beginning of each twenty-four bit word at conductor 200 and a length of one bit period. During the remaining twenty-three bit periods, the pulse has a low value. The control signal is thus a pulse synchronized to the beginning of each serial word. The bit-fill circuit can be implemented using any suitable circuitry, such as twenty-four buffers or a single buffer capable of driving twenty-four loads.

The outputs of the AND gates in AND gate circuit 314 are each connected to a clear input of a respective one of twenty-four flip-flops in flip-flop circuit 318. The outputs of the AND gate circuit 312 are connected to respective preset inputs of the flip-flops in flip-flop circuit 318.

The partial numerator circuit 303 generates the partial numerator from the ten most significant bits of the input word during the first bit period. During the subsequent twenty-three bit time periods, the nine least significant bits of a partial remainder are combined with an appropriate numerator bit to generate the next partial numerator. The partial numerator circuit 303 includes flip-flop circuit 318. A splitter 322 connects the ten most significant bits stored in flip-flop circuit 318 to bus 319 and the next fourteen significant bits to bus 320. The ten bits on bus 319 are the partial numerator. The fourteen bits on bus 320 are connected to a nine-bit partial remainder with the sign bit stripped away using joiner 330 to create a twenty-three bit word.

Joiner 330 outputs twenty-three bits on bus 332 which are connected to a first input of joiner 340. A second input of joiner 340 is connected to a constant voltage 334 having a low logic level "0." The logic 0 is placed in the position of the least significant bit by joiner 340. The twenty-four bit output word of joiner 340 is loaded into the flip-flop circuit 318 via bus 338.

Figure 4:
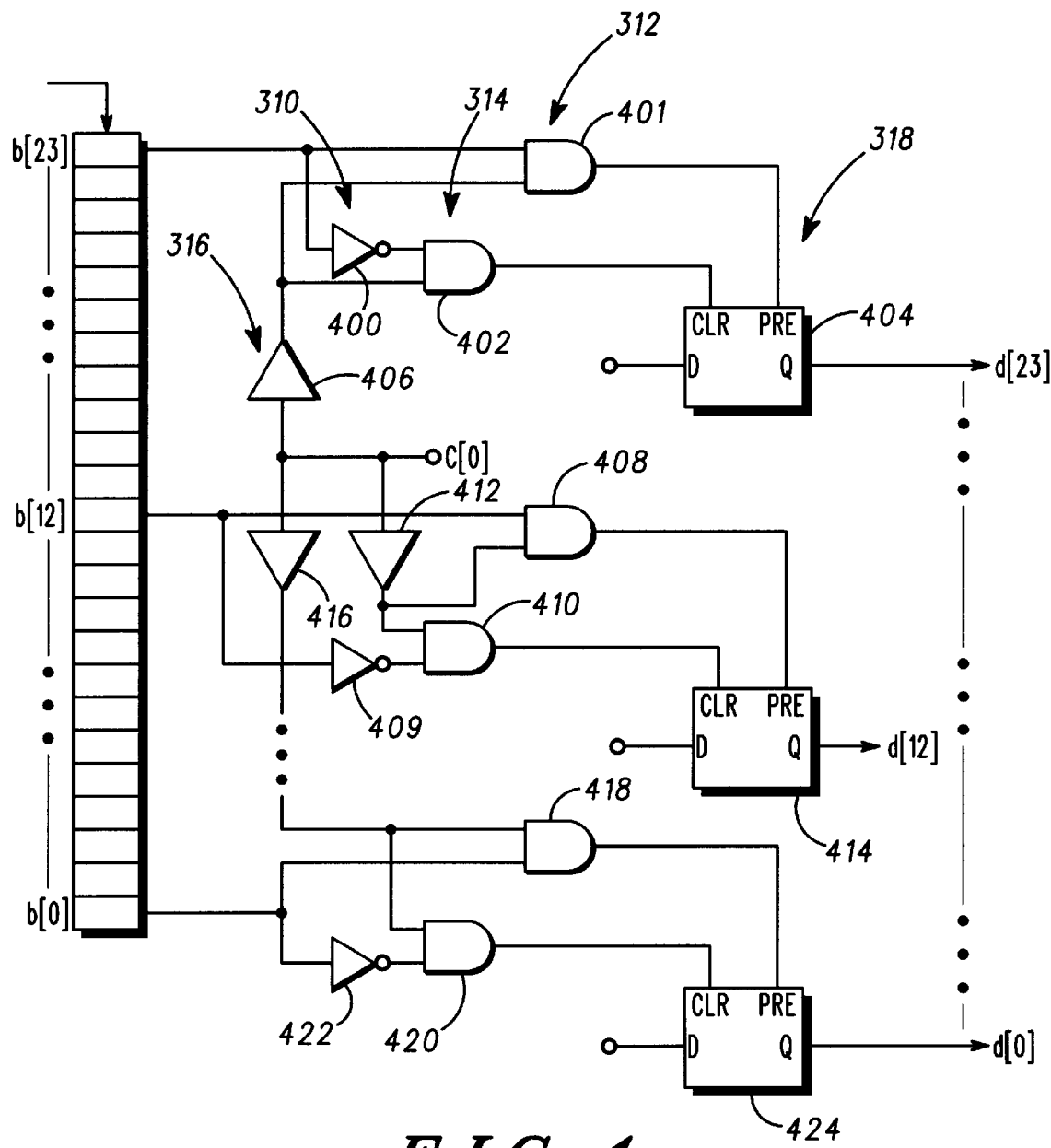
FIG. 4 is a circuit diagram illustrating a load circuit in the pre-divider circuit according to FIG. 3.

FIG. 4 illustrates a parallel load circuit 301 in greater detail with flip-flops 404, 414, and 424 of flip-flop circuit 318 in FIG. 3. AND gates 401 and 402, inverter 400, and flip-flop 404 are associated with the most significant bit b[23]. Bit b[23] is sent to AND gate 401 and inverter 400, whose output is connected to AND gate 402. Flip-flop 404 is connected to the outputs of AND gates 401 and 402. Control signal c[0] is input through the bit-fill circuit 316 shown in FIG. 3, which is implemented by buffer 406. If bit b[23] is a logic 0 when the bit fill circuit output 316 is logic one, the AND gate 401 outputs a logic 0 and the AND gate 402 outputs a logic 1. This controls flip-flop 404 to load a 0. If bit b[23] is a logic 1 when the control signal c[0] is a logic 1, AND gate 401 generates a logic 1 and the AND gate 402 generates a logic 0. This controls flip-flop 404 to have a logic 1 value. During the other twenty-three bit periods during which the serial-to-parallel converter is being loaded with the next word, the preset and clear inputs are both logic 0, and the flip-flop 404 follows its input.

As can be seen in FIG. 4, a similar circuit is provided for each bit of the input word. Thus bit b[12] is loaded into flip-flop 414 via inverter 409 and AND gates 408 and 410 under the control of the control signal c[0] input via buffer 412. Bit b[0] is loaded to flip-flop 424 via inverter 422, and AND gates 418 and 420 under the control of the control signal c[0] input via buffer 416. Bits d[0]–d[23] represent an initial load of the numerator into flip-flop circuit 318 when control signal c[0] is high.

Figure 5:
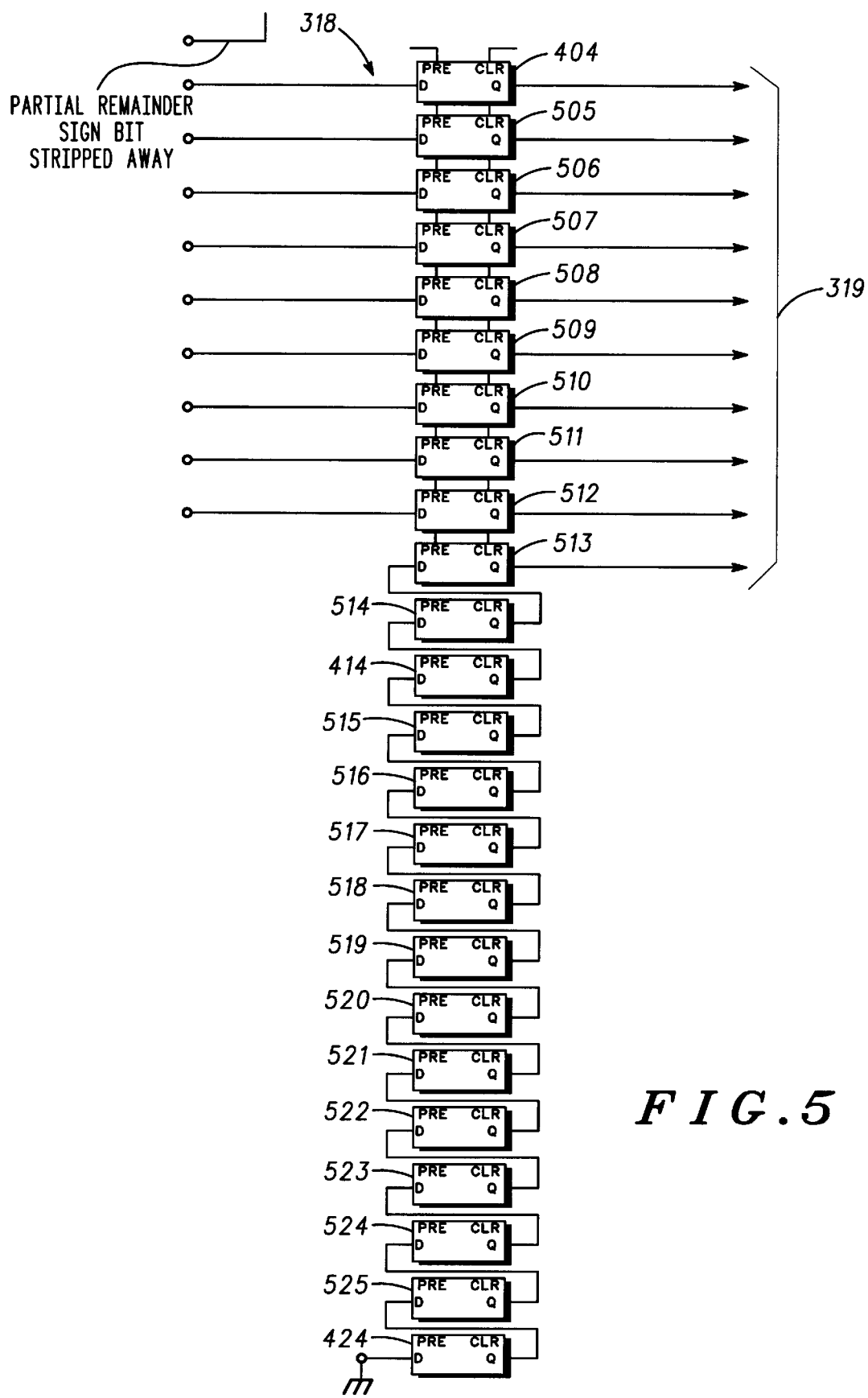
FIG. 5 is a circuit diagram illustrating a flip-flop circuit in the pre-divider circuit according to FIG. 4.

FIG. 5 illustrates a circuit for implementing the partial numerator circuit 303 of FIG. 3. The flip-flops 404, 414, 424 and 505–525 are implemented using D-type, or data, flip-flops. Flip-flop 404 stores the most significant bit of the flip-flop circuit 318, and the other flip-flops store sequentially less significant bits from the top to the bottom of the figure as represented in FIG. 5. The input of flip-flops 404 and 505–512 are connected to receive the nine least significant bits of the partial remainder on bus 207 shown in FIG. 2. The input of the flip-flop 424 associated with the least significant bit is connected to ground. The output of the flip-flops 513–525, 414 and 424 are each connected to the input of the flip-flop associated with the next sequentially greater bit, such that these flip-flops are ganged to shift toward the most significant bit. A low logic level moves into flip-flop 424 with each shift.

Figure 6:
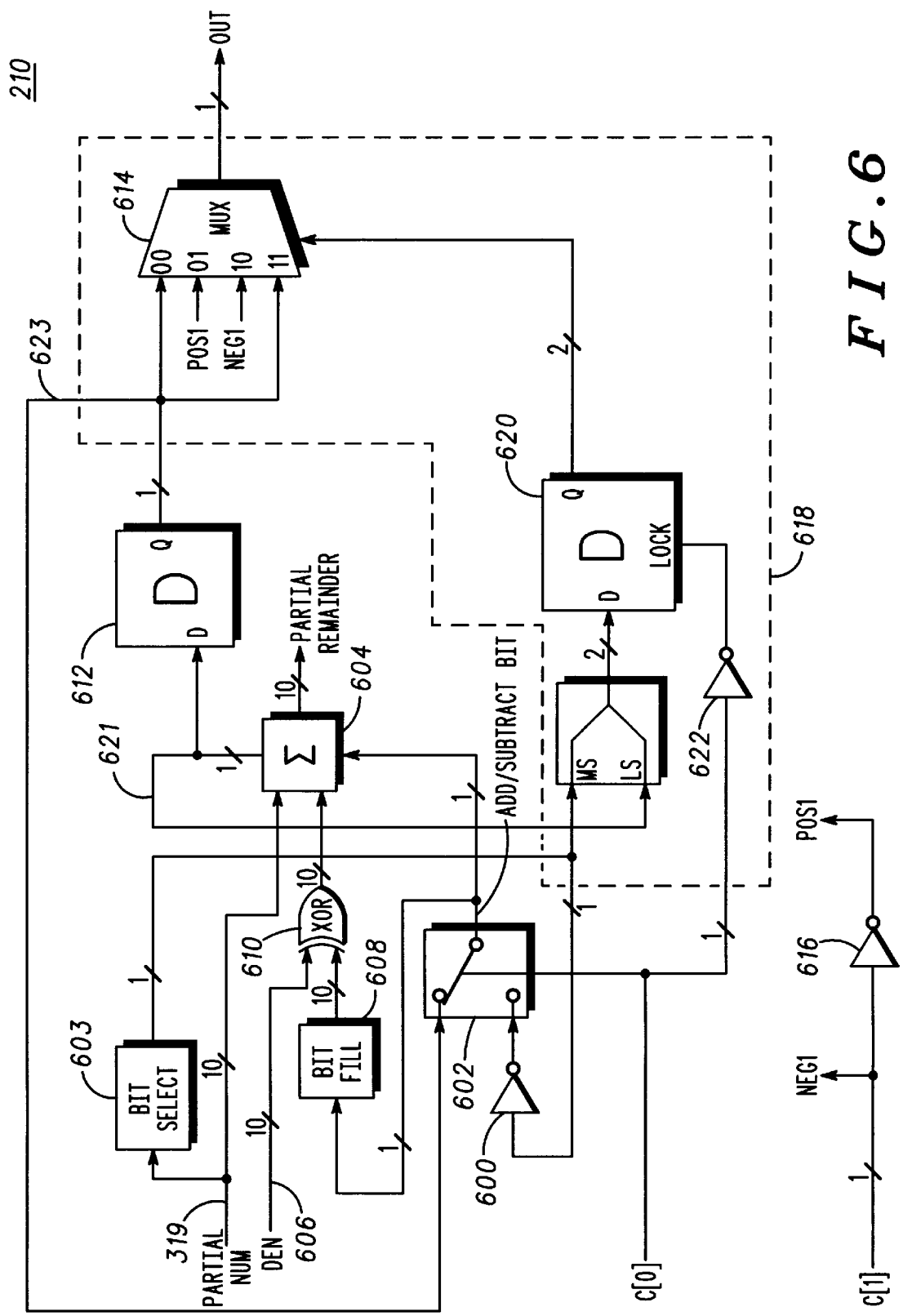
FIG. 6 is a block diagram illustrating a divide circuit of the bit-serial compressor.

The partial numerator on bus 319 is input to adder 604 of divider circuit 210, shown in FIG. 6. Bit select circuit 603 takes the most significant bit of the partial numerator and connects it to an inverter 600. The bit select circuit 603 is implemented using a conductor or a logic buffer connected to the output of flip-flop 404 shown in FIG. 4. The output of the inverter is connected to a switch 602.

The add/subtract signal is the output of switch 602. The switch 602 has a signal input connected to receive an inverted sign bit from inverter 600 that inverts the sign bit on bus 319. The other signal sent to switch 602 is the carryout bit from the previous add operation by adder 604, which is output by a flip-flop 612. The control input of switch 602 is control signal c[0] from bit-serial controller 290 shown in FIG. 2. The switch 602 selects the sign bit of the numerator for the first addition/subtraction of a division cycle, and it selects the carryout bit from the previous addition/subtraction for the other twenty-three bit-periods of the division cycle.

A flip-flop 612 is connected to receive the carryout bit and delay the carryout bit for one bit period. Flip-flop 612 can be implemented using any suitable memory circuit, such as a D-type flip-flop.

The denominator on bus 606 is sent to an exclusive OR (XOR) gate circuit 610. XOR gate circuit 610 comprises ten XOR gates, each receiving a respective one of the denominator bits. The other input of each of the XOR gates receives an add/subtract bit from switch 602 as generated by bit fill circuit 608. If the add/subtract bit is a subtract signal, the adder 604 effectively adds one to the sum of the inverted denominator and the partial numerator, which accomplishes a subtraction in twos-complement arithmetic. If the add/subtract bit is an add signal, the partial numerator is added unaltered to the denominator. The carryout bit of the addition is output on conductor 621. This will be a quotient bit in the case of no overflow.

The carryout bit from the adder 604 is connected to a overflow control circuit 618 and the input of a flip-flop 612. The output of flip-flop 612 is connected to two inputs of a multiplexer 614. The multiplexer 614 is controlled by two bits output from the overflow control circuit 618 to select the carryout bit of the adder from flip-flop 612, a positive limit, or a negative limit. In this example, the negative limit is generated using control signal c[1] and the positive limit is simply the twos-complement inversion of control signal c[1], which is output from inverter 616.

The overflow control circuit 618 detects an overflow condition using the sign bit of a word and the carryout bit of the first partial remainder calculation for that word. These bits are each input to the input of a respective flip-flop in a flip-flop circuit 620. The lock input for each of the flip-flops in flip-flop circuit 620 is an inverted control signal c[0] from inverter 622. The flip-flop circuit 620 is loaded at the beginning of each word and held until the beginning of a next word. The control input of the multiplexer 614 is thus selected at the beginning of each word and held for the entire word.

The multiplexer input is selected according to the following criteria:

1) if the partial numerator is positive and less than the divisor, the sign bit is 0 and the carryout is 0, such that input 00 is selected;
2) if the partial numerator is positive and greater that the divisor, the sign bit is 0 and the carryout is 1 such that input 01 is selected;
3) if the partial numerator is negative and its absolute value greater that the divisor, sign bit is 1 and the carryout is 0 such that input 10 is selected; and
4) if the partial numerator is negative and its absolute value is less than or equal to the divisor, the sign bit is 1 and the carryout is 1, such that input 11 is selected.

The first and forth conditions represent conditions that will produce a valid division, such that the result of the division is output. The other two conditions represent overflow conditions. In the overflow conditions, a limit signal is selected. The positive limit being the greatest positive value and the negative limit being the least negative value.

Figure 7:
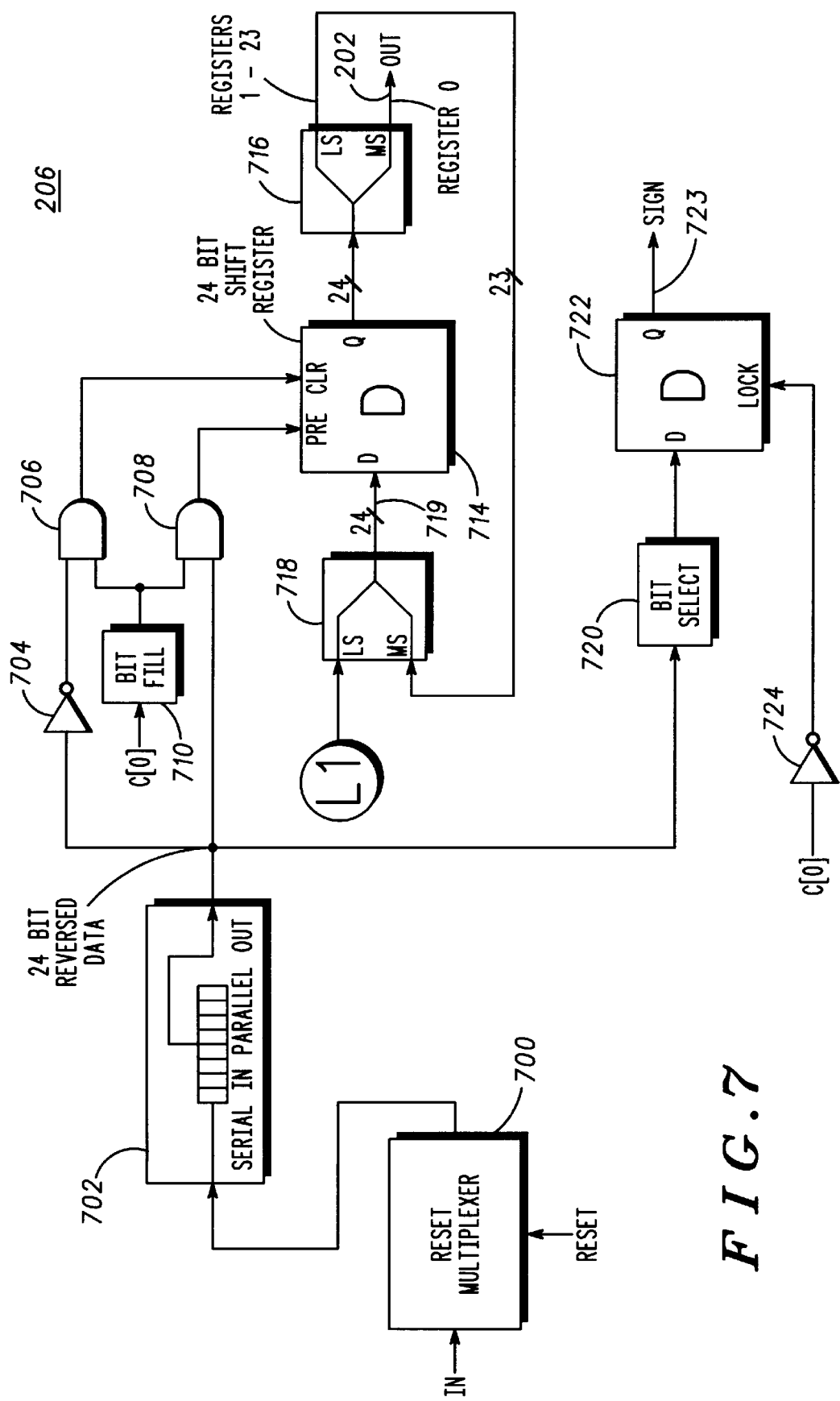
FIG. 7 is a block diagram illustrating a most significant bit (MSB) first to least significant bit (MSB) first converter.

FIG. 7 shows a preferred implementation of the MSB/LSB converter 206 shown in FIG. 2. This converter includes a bit-serial reset multiplexer 700, a serial-to-parallel converter 702, an inverter circuit 704, logical AND gate circuits 706 and 708, and a bit-fill circuit 710 connected to load flip-flops in flip-flop circuit 714. The reset multiplexer 700, serial-to-parallel converter 702, inverter circuit 704, logical AND gate circuits 706 and 708, and bit-fill circuit 710 are identical to circuitry 306–316 in FIG. 3 and operate to load flip-flop circuit 714 at the beginning of each word. The flip-flop circuit 714 includes twenty-four flip-flops each receiving a respective one of the bits from the serial-to-parallel converter 702. The most significant bit of the word input to serial-to-parallel converter 702 is input to the last of the twenty-four flip-flops, register 23, in flip-flop circuit 714. The remaining twenty-three bits of the input word are input into sequential flip-flops such that the first register, register 0, receives the least significant bit.

The output of the first shift register in flip-flop circuit 714 is connected through splitter 716 to conductor 202, which is the bit-serial compressor 106 output. The other twenty-three outputs of the flip-flop circuit 714 are separated by splitter 716 and combined with a logic 0 in joiner 718. Logic 0 is loaded into register 23 of flip-flop circuit 714. The circuitry 714, 716, 718 can be implemented by connecting the flip-flops of flip-flop circuit 714 such that the output of one flip-flop is connected to the input of the next flip-flop. In this way, the bits of a word can be shifted through the shift registers. The last shift register has its input connected to ground, such that a low logic level is loaded into the last shift register each time the bits are shifted by the flip-flop circuit 714. This circuit thus outputs compressed data in LSB first format.

The register of serial-to-parallel converter 702 that contains the most significant bit of the word is sent to bit select circuit 720 at the beginning of each serial word. The bit select circuit 720 can be a buffer, a conductor, or the like. This sign bit is input to a flip-flop 722. The lock input to the flip-flop 722 is connected to an inverter 724, which inverts the control signal c[0]. At the beginning of each word input to the shift register, when control signal c[0] goes to a low logic level for one bit period, the sign bit is loaded into flip-flop 722. The output of flip-flop 722 holds the sign bit on conductor 723 throughout the word.

The output of the MSB/LSB converter 206 on conductor 202 is the output signal of the bit-serial compressor 106. FIG. 8 shows a preferred embodiment of absolute value circuit 216 shown in FIG. 2. To actually compute the absolute value of the negative number, one should be added to the LSB. To reduce the number of gates needed in the absolute value circuit, however, the step of adding one to the LSB has been omitted which does not affect the operation of the compressor. The absolute value circuit includes an inverter 800 and a switch 802. The switch 802 selects either the data or the inverted data according to the sign of the word. If the word is negative, the output of the inverter 800 is selected. If the word is positive, the data passes through undisturbed.

Figure 9:
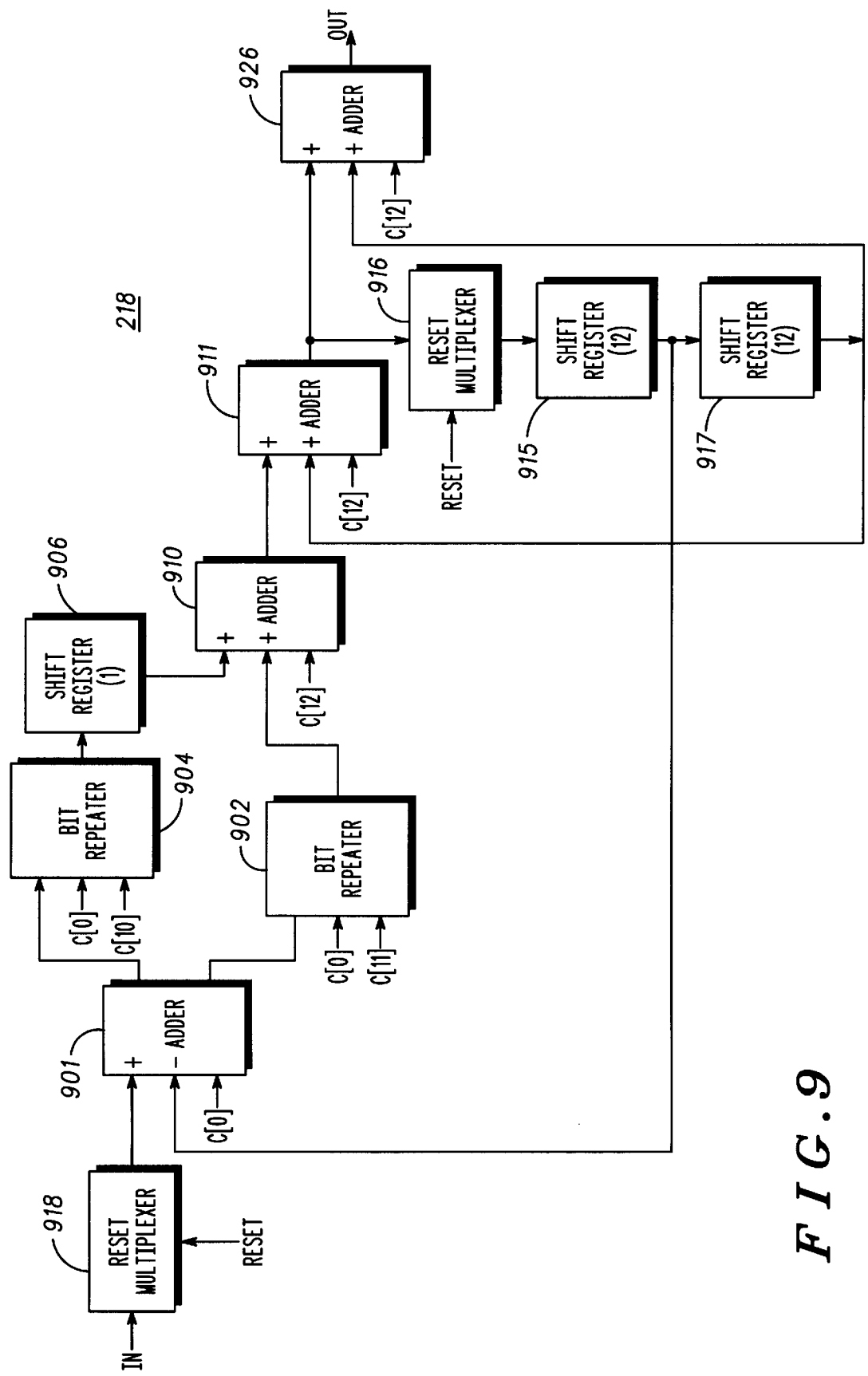
FIG. 9 illustrates a signal flow diagram of a reduced complexity first-order lowpass wave digital filter.

FIG. 9 shows a bit-serial implementation of a simplified first-order lowpass wave digital filter. This bit-serial filter can be used in bit-serial filter 218 shown in FIG. 3. A combination of the three bit-serial building blocks is used to build a twenty-four bit IIR wave digital filter. Reset multiplexers 918, 916 allow the filter to be reset without the overhead of resettable flip-flops as described in application Ser. No. 08/631,321 entitled "Method and Apparatus for Setting a Bit-Serial Filter to an All-Zero State" by James C. Baker and Denise Riemer. An input signal enters adder block 901. The bit-serial controller 290 shown in FIG. 2 sends a "one" control signal c[0] as the LSB of each word enters the adder. Bit-repeater block 902 scales the output of adder block 901 by a coefficient, $2^{-11}$, by shifting each bit in an input word eleven bits to the right. Bit-serial controller 290 shown in FIG. 2 sends a logic 1 signal c[0] to the bit-repeater block 902 when the LSB of a word enters the block and another logic 1 signal c[11], which is eleven bit time periods later, to indicate the magnitude of the scaling coefficient. Meanwhile the output of adder block 901 also enters bit-repeater block 904, which scales an input word by $2^{-10}$ as instructed by signals c[0] and c[10] from bit-serial controller 290 shown in FIG. 2. The output of bit-repeater block 904 is delayed one bit time period by shift register 906 so that the addends arrive simultaneously at adder block 910 when bit-serial controller 290 shown in FIG. 2 sends control signal c[12]. The output of adder block 910 is the output of adder block 901 scaled by a coefficient A, equivalent to $2^{-10}$ plus $2^{-11}$, which produces a filter cut-off frequency of 8 Hz. The output of adder block 810 then enters adder block 911. Again, the bit-serial controller in FIG. 2 indicates using signal c[12] when the LSB of a word enters an adder.

The output of adder block 911 is delayed twelve times the bit time period ($12/f_{bit}$) using shift register 915. Because bit-repeater blocks 902, 904 and shift register 906 have already delayed a word by twelve bit time periods, only twelve additional bit time period delays are required to produce a unit delay of twenty-four bit time periods at the output of shift register 915. The output of shift register 915 is negatively fed back to adder block 901, positively fed back to adder block 911 through shift register 917, and positively fed back to adder block 926 through shift register 917. Shift register 917 delays a word by twelve times the bit time period ($12/f_{bit}$) so that the addends to adder blocks 911 and 926 arrive when the bit-serial controller sends logic 1 control signal c[12]. The filter output signal exits adder block 926.

The output of the lowpass filter is sent to delay circuit 220 shown in FIG. 2. Delay is introduced to synchronize the arrival of the beginning of a denominator signal with the arrival of the beginning of a partial numerator at the inputs to divider circuit 210 due to a new numerator value. The delayed signal output by the delay circuit 220 is input to comparator circuit 224 shown in FIG. 2.

Figure 10:
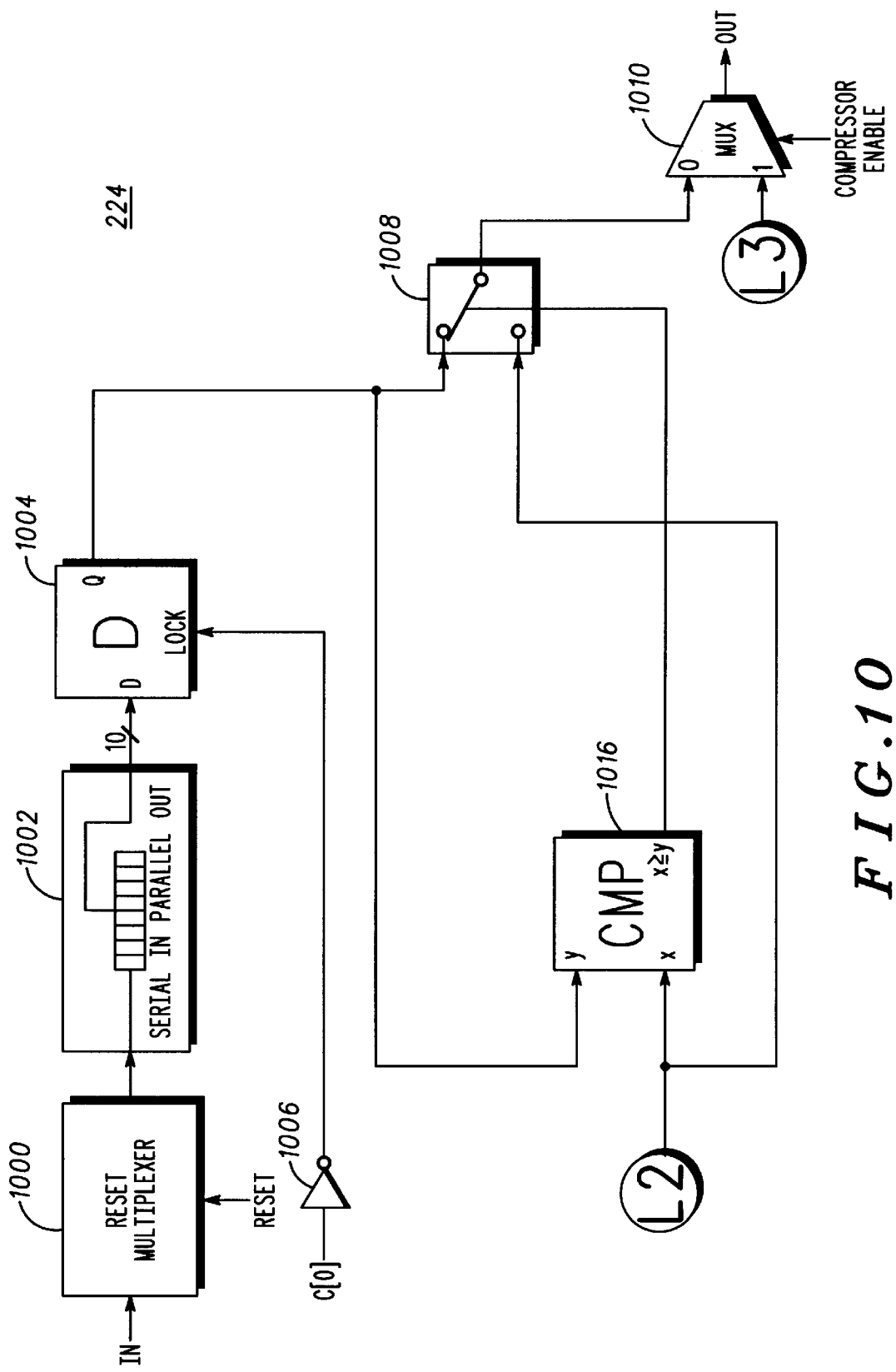
FIG. 10 is a block diagram illustrating a comparator circuit of the bit-serial compressor.

FIG. 10 shows a preferred embodiment of comparator circuit 224 shown in FIG. 2. The comparator circuit includes a reset multiplexer 1000 and a serial-to-parallel converter 1002. The serial-to-parallel converter 1002 outputs a ten-bit value that is loaded into flip-flop circuit 1004. The flip-flop circuit 1004 includes ten flip-flops, each of which receives a respective one of the bits output by the serial-to-parallel converter 1002. An inverter 1006 inverts the control signal c[0] such that the lock signal input changes to a low logic level only during the bit period of the first bit of each word. The lock signal is input to each of the flip-flops in flip-flop circuit 1004 such that the flip-flops are loaded at the beginning of each word and the value is held for the entire word. The output of the flip-flop circuit 1004 is the averaged signal generated by the lowpass filter.

The averaged signal from flip-flop circuit 1004 is connected through a switch 1008 to multiplexer 1010. The averaged signal is also connected to comparator 1016. Comparator 1016 compares a predetermined value L2 to the averaged signal from flip-flop circuit 1004. Predetermined value L2 represents a −34 dB compression. Thus when the signal from flip-flop circuit 1004 is less than −34 dB, the comparator 1016 directs the compressor gain to be one-to-one.

The compressor enable input to multiplexer 1010 selects the constant L3 to turn the compressor off or the output of 1008 to turn the compressor on. The compressor can thus be turned off during test modes.

In operation, and with reference to all of the drawing figures, the AND gate circuits 312 and 314 are enabled upon the rising edge of the control signal c[0] to load the output of the serial-to-parallel converter 308 into flip-flop circuit 318. The ten most significant bits of the input word are then available at the output of the flip-flop circuit 318 as the first partial numerator. For each of the next twenty-three bit periods, the flip-flops 404 and 505–512 will receive nine bits of the partial remainder on bus 207 and the flip-flop 513 will receive the most significant remaining bit to sequentially create twenty-three ten-bit partial numerators. The pre-divider circuit thus outputs twenty-four partial numerators over twenty-four bit periods.

The denominator is the signal on bus 606 throughout the division cycle. A division cycle is the twenty-four partial divisions associated with each word.

Adder 604 in divider circuit 210 performs twos complement controlled addition between the partial numerator from pre-divider circuit 208 and the denominator. At the initiation of a division cycle, control signal c[0] goes to a high logic level, and the sign bit of the word is inverted and input as the add/subtract signal during the first bit period. After the first partial division of a division cycle, the add/subtract control signal is the carryout on conductor 623 from the previous partial division in that cycle. If the add/subtract signal is logic 0, the denominator is added to the partial numerator.

If the add/subtract signal is logic 1, the denominator is subtracted from the partial numerator. To subtract the denominator, the XOR gate circuit 610 inverts the denominator and the adder 604 adds 1. This produces the twos-complement negative of the denominator on bus 606, which is then added to the partial numerator. To add the denominator and partial numerator, the denominator is passed through the XOR gate unaltered and added to the partial numerator.

After the twenty-four partial divisions for one division cycle are completed, the control signal c[0] will initiate a new division cycle and the twenty-four partial divisions will be conducted for the next twenty-four bit segment.

The multiplexer 614 outputs the carryout bits, the positive threshold, or the negative threshold. The determination of which input to the multiplexer 614 is to be selected is made based on the carryout bit from the first partial division in a cycle and the sign bit of the partial numerator at the beginning of the cycle. The positive or negative threshold is selected to avoid overflow.

The MSB/LSB first converter 206 loads a serial MSB first word in parallel and outputs the word serially in reverse order. This is accomplished by loading the MSB first word into a serial-to-parallel converter 702. The contents of serial-to-parallel converter 702 are loaded in parallel into the flip-flop circuit 714. The least significant bit is loaded into the first flip-flop and the most significant bit is loaded into the last flip-flop. The output of the first flip-flop is the output of the converter. The bits in the flip-flop circuit 714 are shifted forward one bit position during the next twenty-three bit periods until all twenty-four bits are output on conductor 202. The sign bit is latched in flip-flop 722 for the entire twenty-four bit periods that the word is output.

The absolute value circuit 216 outputs the absolute value of the twenty-four bit signal output by the MSB/LSB converter 206 under the control of the sign bit on conductor 723. If the sign bit is negative, the signal on conductor 202 is inverted in inverter 800. If the sign bit is positive, the signal on conductor 202 is passed straight through.

The bit-serial filter 218 is a lowpass filter having a cut-off frequency of 8 Hz and sampling rate of 32 kHz. The filter produces a signal having the average level of the output of the absolute value circuit over a predetermined time period, such as twenty milliseconds. The output of the filter circuit is delayed in delay circuit 220.

In the comparator circuit 224, if the averaged signal output from flip-flop circuit 1004 is less than the predetermined level L2, then the output of comparator 1016 is a logic 1. Otherwise this output is a logic 0. When the control signal from comparator 1016 is a logic 1, the switch 1008 selects the predetermined level L2 as the feedback denominator signal. If the control signal from the comparator is a logic 0, then the switch 1008 selects the averaged signal from flip-flop circuit 1004 as the denominator. In this way, the denominator does not become smaller that the predetermined value, and low level noise is not greatly amplified by bit-serial compressor 106.

Thus, a bit-serial digital compressor can be used to reduce gate count, silicon area, and current drain in a circuit. While specific components and functions of the bit-serial digital compressor are described above, fewer or additional functions could be employed by one skilled in the art within the true spirit and scope of the present invention. The invention should be limited only by the appended claims.

We claim:

1. A bit-serial digital compressor comprising:
a bit-serial input for receiving a digital word representing a numerator;
a divider circuit connected to the bit-serial input for dividing the digital word representing the numerator by a digital word representing a denominator and generating a digital word representing a quotient;

a bit-serial absolute value circuit connected to the divider; and a bit-serial filter connected to the bit-serial absolute value circuit for generating a digital word representing a next denominator.

2. A bit-serial digital compressor according to claim 1 further comprising:

a bit-serial pre-divider circuit connected to the bit-serial input and an input of the divider circuit for generating a digital word representing a partial numerator from the digital word representing the numerator.

3. A bit-serial digital compressor according to claim 2 wherein the bit-serial pre-divider circuit generates N M-bit digital words representing partial numerators, where N is equal to the number of bits in the digital word representing the numerator and M is equal to the number of bits in a digital word representing the partial numerator.

4. A bit-serial digital compressor according to claim 2 wherein the divider circuit also generates a digital word representing a partial remainder that is sent to the pre-divider circuit.

5. A bit-serial digital compressor according to claim 2 wherein the divider circuit detects an overflow condition using a carryout bit of a first partial remainder calculation of a division cycle and a sign bit of the digital word representing the numerator.

6. A bit-serial digital compressor according to claim 5 wherein the divider circuit generates a threshold signal as the digital word representing the quotient during the overflow condition.

7. A bit-serial digital compressor according to claim 1 further comprising:

a comparator connected to the bit-serial filter for comparing an output of the bit-serial filter to a threshold signal and generating a digital word representing a next denominator equivalent to the greater of either the output of the bit-serial filter or the threshold signal.

8. A bit-serial digital compressor according to claim 7 wherein the threshold signal represents at least a −30 dB compression.

9. A bit-serial digital compressor according to claim 1 further comprising:

a MSB/LSB converter connected to the divider circuit for converting the digital word representing the quotient from MSB-first format to LSB-first format.

10. A bit-serial digital compressor according to claim 1 wherein the bit-serial filter is a wave digital filter.

11. A bit-serial digital compressor according to claim 1 wherein the bit-serial filter is a lowpass filter.

12. A bit-serial digital compressor comprising:

a bit-serial pre-divider circuit for generating a digital word representing a partial numerator from a digital word representing a numerator;

a divider circuit connected to the bit-serial pre-divider circuit for dividing the digital word representing the partial numerator by a digital word representing a denominator and generating a digital word representing a quotient;

a bit-serial absolute value circuit connected to an output of the divider circuit;

a bit-serial filter connected to the bit-serial absolute value circuit for generating an averaged signal; and a comparator circuit connected to the bit-serial filter for comparing the averaged signal to a threshold signal and generating a digital word representing a denominator equivalent to the greater of either the averaged signal or the threshold signal.

13. A bit-serial digital compressor according to claim 12 wherein the divider circuit generates a digital word representing a partial remainder that is fed back to the pre-divider circuit.

14. A bit-serial digital compressor according to claim 12 wherein the divider circuit performs N partial divisions in a complete division cycle, where N is equivalent to the number of bits in the digital word representing the numerator.

15. A transmitter comprising:

an amplifier having a gain set to prevent overflow in a bit-serial compressor; and a bit-serial compressor connected to the amplifier comprising:

a divider circuit for dividing a digital word representing a numerator by a digital word representing a denominator and generating a digital word representing a quotient;

a bit-serial absolute value circuit connected to the divider;

bit-serial filter connected to the bit-serial absolute value circuit for generating an averaged signal; and a comparator circuit for comparing the average signal to a threshold signal and outputting a greater one of the averaged signal or the threshold signal as a digital word representing a next denominator.

16. A radiotelephone comprising:

an amplifier having a gain set to prevent overflow in a bit-serial compressor; and a bit-serial compressor connected to the amplifier comprising:

a bit-serial pre-divider circuit for generating a digital word representing a partial numerator from a digital word representing a numerator;

a divider circuit connected to the bit-serial pre-divider circuit for dividing the digital word representing the partial numerator by a digital word representing a denominator and generating a digital word representing a quotient;

a bit-serial absolute value circuit connected to the divider circuit;

bit-serial filter connected to the divider circuit for generating an averaged signal; and a comparator circuit connected to the bit-serial filter for comparing the averaged signal to a threshold signal and outputting a greater one of the averaged signal or the threshold signal as a digital word representing a next denominator.

17. A bit-serial digital divider comprising:

a bit-serial pre-divider circuit connected to a bit-serial input for generating a digital word representing a partial numerator from a digital word representing a numerator and a digital word representing a partial remainder;

a divider circuit connected to the bit-serial pre-divider circuit for dividing the digital word representing the partial numerator by a digital word representing a denominator and generating a carryout bit and also generating the digital word representing the partial remainder that is fed back to the bit-serial pre-divider circuit.

18. A bit-serial digital divider according to claim 17 wherein the divider circuit further comprises:

an overflow control circuit for generating a quotient bit from the carryout bit if no overflow occurs, a positive limit if positive overflow occurs, or a negative limit if negative overflow occurs.

19. A bit-serial digital divider according to claim 17 wherein the bit-serial input is in LSB-first format and the bit-serial pre-divider converts the bit-serial input from LSB-first format to MSB-first format.

20. A bit-serial digital divider according to claim 19 further comprising:

a MSB/LSB converter circuit for converting an output of the divider from MSB-first format to LSB-first format.

* * * * *